United States Patent [19]

Milner

[11] Patent Number: 4,530,044
[45] Date of Patent: Jul. 16, 1985

[54] SELF-BALANCING DC-SUBSTITUTION MEASURING SYSTEM

[75] Inventor: Christopher J. Milner, Northbridge, Australia

[73] Assignee: Unisearch Limited, Kensington, Australia

[21] Appl. No.: 544,147

[22] Filed: Oct. 21, 1983

[30] Foreign Application Priority Data

Oct. 21, 1982 [AU] Australia .............................. PF6453

[51] Int. Cl.³ .............................................. G01F 1/58
[52] U.S. Cl. .................................. 323/365; 324/106; 73/204
[58] Field of Search ............... 363/365, 366, 367, 369; 324/DIG. 1, 105, 106; 73/204

[56] References Cited

U.S. PATENT DOCUMENTS

| | | | |
|---|---|---|---|
| 2,997,652 | 8/1961 | Engen | 324/106 |
| 3,597,676 | 8/1971 | Moore | 73/204 |
| 3,611,130 | 10/1971 | Larsen et al. | 324/106 |
| 4,008,610 | 1/1985 | Larsen et al. | 73/204 |

OTHER PUBLICATIONS

N. T. Larsen, A New Self-balancing DC-Substitution RF Power Meter, Dec. 1976.

Primary Examiner—Peter S. Wong
Assistant Examiner—Judson H. Jones
Attorney, Agent, or Firm—Millen & White

[57] ABSTRACT

A self-balancing DC-substitution measuring system includes a temperature dependant resistor (TDR) which is placed in one leg of a Wheatstone Bridge circuit, diagonally opposed first and second nodes of the bridge being driven respectively by the outputs of two operational amplifiers such that the potential at each of these first and second nodes, when measured with respect to a common reference point is equal in magnitude and opposite in polarity to the other. Each of the amplifiers has a pair of differential inputs and each of these inputs are connected to either of the remaining third and fourth nodes of the bridge circuit or to the common reference point, no two inputs from the same amplifier being connected to the same point and each of the third and fourth nodes and the common reference point having at least one amplifier input connected to it. The arrangement of the connections to the amplifier inputs is such that the third and fourth nodes of the bridge are kept at a potential substantially equal to that at the reference point and the amplifiers are prevented from saturating. Variations in the resistance of the TDR in this circuit, will result in an inbalance in the bridge which in turn causes a change in the potential applied to the first and second nodes of the bridge by the respective amplifiers. The change in potential at the first and second nodes will in turn cause a change in the current flowing through the TDR thereby changing the power being dissipated by the TDR and ultimately changing the temperature of the TDR, and its resistance, such that the bridge is again balanced.

22 Claims, 6 Drawing Figures

SELF-BALANCING DC-SUBSTITUTION MEASURING SYSTEM

BACKGROUND OF THE INVENTION

The present invention relates to self-balancing DC-substitution measuring systems and in particular provides a circuit arrangement which reduces the need for amplifiers having a high common mode rejection ratio (CMRR). Such measuring systems are used in many applications, such as vacuum gauges, gas-composition meters, anemometers, infra-red radiation meters, and radio-frequency circuit power meters.

It has been the practice in the prior art to use negative power-feedback to stabilize the temperature of an electrically heated temperature dependent resistor (TDR). These prior art devices generally make use of a Wheatstone bridge circuit, one arm of which contains the TDR element. A differential amplifier is then used to sense the magnitude and direction of imbalance in the bridge and causes the current through the arm of the bridge containing the TDR to change such that the temperature, and therefore the resistance, of the TDR changes, thereby rebalancing the bridge circuit.

Although measuring systems of this kind are very accurate, they suffer from one common drawback. As the variable being measured by the system alters, the differential amplifier changes the voltage applied to one side of the bridge circuit, which in turn changes the common mode voltage at the input to the amplifier. Therefore, in order to obtain a high degree of accuracy from the measuring system, an amplifier having a high CMRR is required.

Another type of prior art self-balancing DC-substitution measuring system is described in U.S. Pat. No. 4,008,610 by Neil T. Larsen and Gerome R. Reeve. The arrangement devised by Larsen and Reeve overcomes the requirement in the prior art Wheatstone bridge arrangement for an amplifier having a high CMRR. However, the Larsen and Reeve system requires two independently floating bi-polar power supplies which adds considerably to the cost and bulk of the system.

SUMMARY OF THE INVENTION

The aim of the present invention is to provide a self-balancing DC-substitution measuring system using a Wheatstone bridge circuit, in which the dependence upon amplifiers having a high CMRR is reduced without degrading the performance of the system, and in which only one bi-polar supply is used.

According to a first aspect, the present invention consists in a self-balancing DC substitution measuring system comprising:

a temperature dependent resistor element;

three substantially temperature independent reference resistors, said temperature dependent and temperature independent resistors forming a Wheatstone bridge circuit, first and second diagonally opposed nodes of said bridge being supply nodes, and third and fourth diagonally opposed nodes of said bridge being sense nodes;

first voltage dividing means connected between said first and second nodes and having a divider output;

a first and a second differential amplifying means, each of said amplifying means having an inverting and a non-inverting input terminal, and an output terminal, the output terminal of the first of said amplifying means being connected to said first node, and the output terminal of the second of said amplyifying means being connected to said second node; and a power supply for said amplifying means, said supply having dual voltage sources of opposite polarity connected at a common reference point to provide a reference potential, said third node being connected to the inverting input terminal of said first amplifying means, either said fourth node or said reference point being connected to the non-inverting input of said first amplifying means, said divider output being connected to the inverting input of said second amplifying means, said reference point being connected to the non-inverting input of the second amplifying means, and the position of said temperature dependent element in said bridge being such that the measuring system maintains said third and fourth nodes at a potential substantially equal to the reference potential.

According to a second aspect of the invention, the dual voltage source can be replaced by a single voltage source, in which case the reference potential can be established by providing a voltage divider across the power supply.

In a preferred form of the invention, the first voltage dividing means comprises the side of the bridge circuit in which the fourth node is located, the fourth node being the divider output.

In another form of the invention the first voltage dividing means comprises the side of the bridge circuit in which the third node is located, the third node being the divider output. In this form of the invention the temperature dependent resistor element must be located in one of the legs of the bridge circuit which is connected to the fourth node and the fourth node must be connected to the non-inventing input of the first amplifying means.

The measuring system of the present invention may use a temperature dependent resistor having either a negative or a positive temperature coefficient, and in particular applications, a barretter or a thermistor may be used as a bolometer element. However, any other type of temperature dependent resistor may also be used.

BRIEF DESCRIPTION OF THE DRAWINGS

The invention will now be described by way of example with reference to the accompanying drawings in which items with like reference numbers perform similar functions, and in which.

DETAILED DISCUSSION OF THE INVENTION

In each of FIGS. 1, 2, 3, 4, 5 and 6 the symbols "+" and "−" respectively indicate the non-inverting and the inverting input terminals of the designated amplifier.

Figure 1:
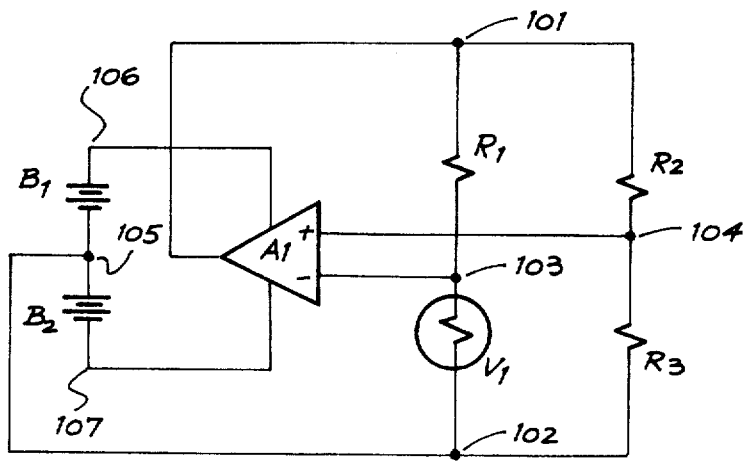
FIG. 1 schematically illustrates a prior art self-balancing DC-substitution measuring system.

Referring now to FIG. 1 a typical prior art self-balancing DC-substitution measuring system has a Wheatstone bridge circuit comprising fixed resistors R1, R2 and R3 forming three legs of the bridge and a temperature dependent resistor V1, having a positive temperature coefficient, forms the fourth leg of the bridge. A high gain operational amplifier A1 has a pair of differential inputs connected across one diagonal of the bridge to nodes 103 and 104, and an output connected to the supply node 101 of the bridge that is remote from V1. A dual power supply is provided by a pair of batteries B1 and B2 connected at a center point 105. The positive and negative terminals 106 and 107 of the power supply are connected to positive and negative supply terminals of the amplifier A1 respectively, while the center point 105 is connected to the supply node 102 of the bridge that is directly connected to one terminal of V1.

In operation amplifier A1 senses the magnitude and direction of imbalance of the bridge and causes the potential at supply node 101, and hence the current through the temperature dependent resistor V1, to change such that the resistance of the temperature dependent resistor is driven in a direction to rebalance the bridge.

As previously explained self-balancing Wheatstone bridge systems of this kind are subject to the problem that, as energy is absorbed or dissipated by the temperature dependent resistor V1, there is a change in the common-mode voltage at the input of the amplifier A1. Thus for accurate measurements, it is necessary to employ, as amplifier A1, amplifier having a very high common mode rejection ratio.

Figure 2:
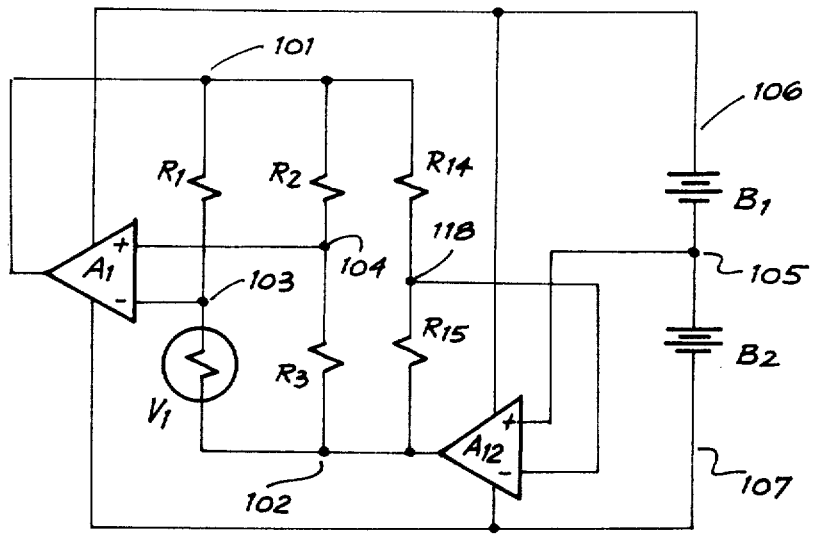
FIG. 2 schematically illustrates a first embodiment of the measuring system of the present invention.

Referring now to FIG. 2, the bridge formed by resistors R1, R2 and R3 and temperature dependent resistor V1 is similar to the bridge of the prior art system. The amplifier A1 and the power supply formed by the pair of batteries B1 and B2 also perform substantially the same function as the corresponding devices of the prior art system.

The improvement of the present invention over the prior art lies in the provision of a second amplifier to drive the second supply node 102 of the bridge circuit. As illustrated in FIG. 2, amplifier A12 drives the node 102 of the bridge. The differential inputs of the amplifier A12 are connected to the common point 105 of the power supply and to a node 118 of a resistor network provided by resistors R14 and R15. If the ratio R14:R15 equals the ratio R2:R3, this arrangement will control the potential at nodes 103 and 104 to be substantially equal to the potential at the power supply common point 105. Further if the ratio R2:R3 is 1:1 the potential difference between the common point 105 and node 101 will be substantially equal in magnitude and opposite in sign to the potential difference between the common point 105 and node 102.

Figure 3:
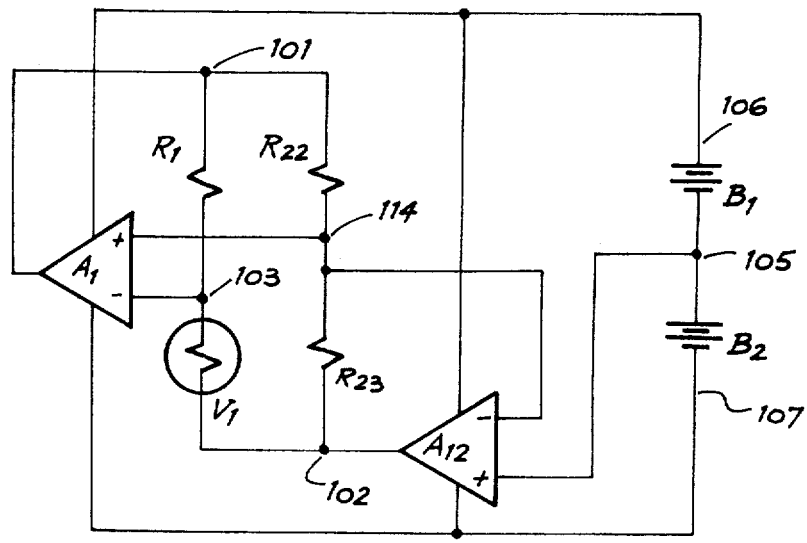
FIG. 3 schematically illustrates a second and preferred embodiment of the measuring system of the present invention.

The simplified and preferred form of the invention illustrated in FIG. 3 is essentially identical to the embodiment of FIG. 2, with the exception that resistors R22 and R23 perform the function of R2 and R3 as well as that of R14 and R15 of the FIG. 2 embodiment.

In the circuit of FIG. 3 the ratio R22:R23 is preferably 1:1, causing the potential difference between nodes 101 and 105 to be substantially equal in magnitude and opposite in sign to the potential difference between nodes 102 and 105. As in the circuits of FIG. 2 amplifier A1 of FIG. 3 provides a potential at node 101 such that the potential difference between nodes 101 and 103 is substantially equal in magnitude and sign to the potential difference between nodes 101 and 114, which is in turn controlled to be substantially equal in magnitude and sign to that between nodes 101 and 105 by virtue of amplifier A12 (assuming R2:R3=R14:R15=1:1 in FIG. 2).

Figure 4:
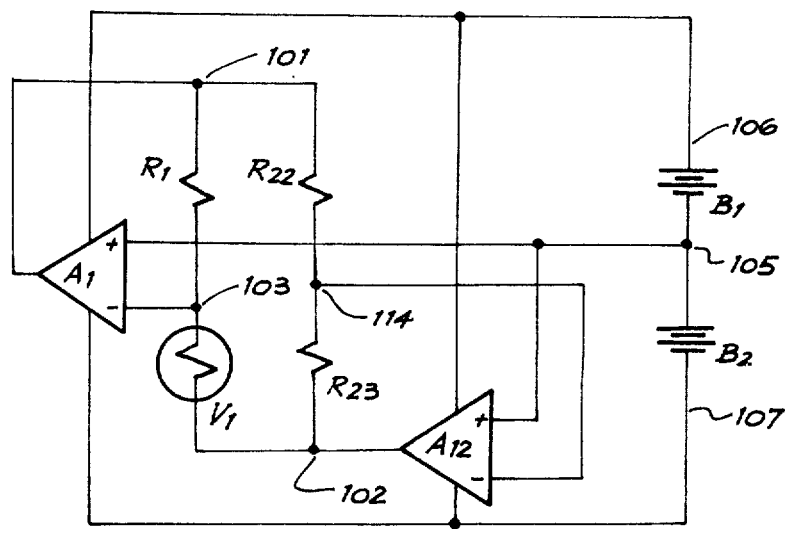
FIG. 4 schematically illustrates an alternative circuit to that illustrated in FIG. 3.

An alternative circuit to that of FIG. 3 is shown in FIG. 4 in which the non-inverting input of amplifier A1 is connected to node 105 instead of node 114. However, as the potential at node 114 is controlled by amplifier A12 to be substantially equal to that at node 105, it will be recognized by a person skilled in the art that these embodiments operate in a similar manner.

Figure 5:
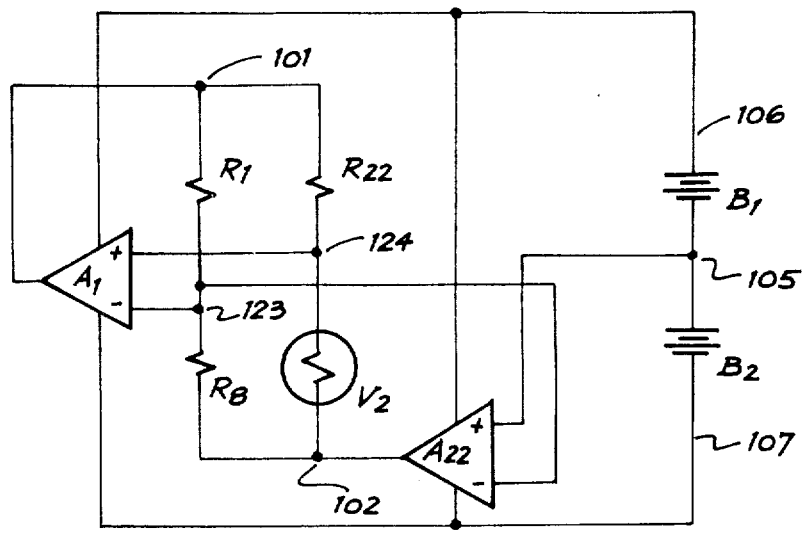
FIG. 5 schematically illustrates the embodiment of FIG. 3 when configured for a TDR having a negative temperature coefficient.

The circuits of FIGS. 1 to 4 have been described for the case where the TDR V1 is a positive temperature coefficient device. FIG. 5 illustrates an alternative circuit to the circuit of FIG. 3 for the case where the TDR is a negative temperature coefficient device. By comparing FIGS. 3 and 5 it will be recognized that the circuit of FIG. 5 is equivalent to the circuit obtained if a negative temperature coefficient TDR was used in the circuit of FIG. 3 but located in the position occupied by R23, and the inverting input of the second amplifer A12 swapped from the fourth node 114 to the third node 103.

Figure 6:
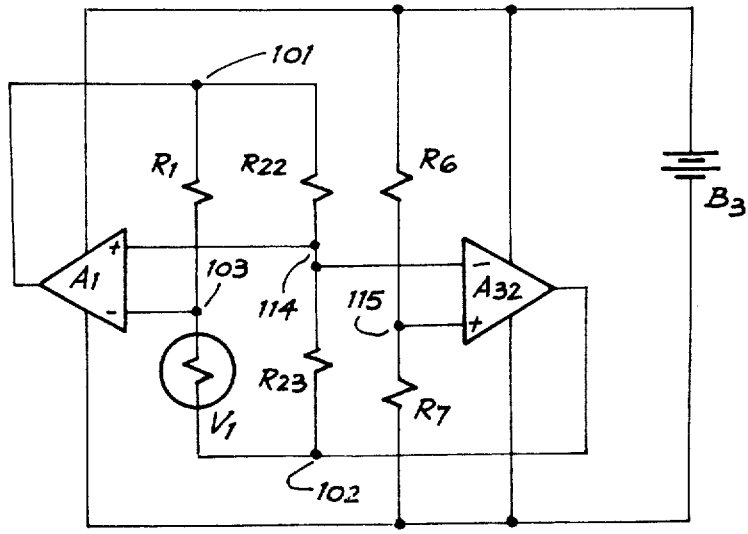
FIG. 6 schematically illustrates the embodiment of FIG. 3 when the dual power supply is replaced by a single power supply, with a resistive divider to establish a reference potential.

In FIG. 6 the dual supply B1, B2 of FIG. 3 is replaced by a single supply B3 and the reference point 115 corresponding to point 105 of FIG. 3 is established by a resistive divider network, comprising resistors R6, R7, connected across the supply B3. It will be recognized that the resistive divider network R6, R7 can be replaced by an active circuit such as, for example, a pair of zener diodes connected in series, each zener diode having an associated series resistor and each of the zener diode-resistor combinations being located on opposite sides of the reference point.

It will also be recognized that in the circuits of FIGS. 2–6 the common mode voltage at the inputs of amplifiers A1 and A12 (A22, 32) is substantially constant and equal to the potential of the supply common point 105 (115), and therefore, commonly available mass produced operational amplifiers may be used without degrading the performance of the system, while at the same time providing a cost reduction.

Further, it will be recognized that it is not necessary for temperature dependent resistor V1 or V2 to occupy the position in the bridge shown in the drawings. By way of example, in the circuits of FIGS. 2 to 4 and FIG. 6 a positive temperature coefficient device can occupy the position in which resistor R2 (R22) is shown, while a negative temperature coefficient device must occupy one of the positions in which resistors R1 and R3 (R23) are shown. In the circuit of FIG. 5 the negative temperature coefficient TDR may be replaced by a positive temperature coefficient TDR located in the position in which R22 is shown, however, placement of the TDR in any position other than those described above will result in an unstable circuit. Similarly numerous other variations and modifications may be made to the invention as described without departing from the spirit or scope of the invention as broadly described.

We claim:

1. A self-balancing DC substitution measuring system comprising:
   a temperature dependent resistor element;
   three substantially temperature independent reference resistors, said temperature dependent and temperature independent resistors forming a Wheatstone bridge circuit, first and second diagonally opposed nodes of said bridge being supply nodes, and third and fourth diagonally opposed nodes of said bridge being sense nodes;

first voltage dividing means connected between said first and second nodes and having a divider output;

a first and a second differential amplifying means, each of said amplifying means having an inverting and a non-inverting input terminal, and an output terminal, the output terminal of the first of said amplifying means being connected to said first node, and the output terminal of the second of said amplifying means being conected to said second node; and a power supply for said amplifying means, said supply having dual voltage sources of opposite polarity connected at a common reference point to provide a reference potential, said third node being connected to the inverting input terminal of said first amplifying means, either said fourth node or said reference point being connected to the non-inverting input of said first amplifying means, said divider output being connected to the inverting input of said second amplifying means, said reference point being connected to the non-inverting input of the second amplifying means, and the position of said temperature dependent element in said bridge being such that the measuring system maintains said third and fourth nodes at a potential substantially equal to the reference potential.

2. The measuring system of claim 1 wherein the first voltage dividing means is provided by two legs of the bridge circuit disposed on either side of the fourth node, the fourth node being the divider output.

3. The measuring system of claim 2 wherein the temperature dependent resistor element has a positive temperature coefficient and is disposed between nodes 2 and 3 or between nodes 1 and 4 of the bridge circuit.

4. The measuring system of claim 3 wherein the temperature dependent resistor element is a barretter.

5. The measuring system of claim 2 wherein the temperature dependent resistor element has a negative temperature coefficient and is disposed between nodes 1 and 3 or between nodes 2 and 4 of the bridge circuit.

6. The measuring system of claim 5 wherein the temperature dependent resistor element is a thermistor.

7. The measuring system as claimed in claim 1 wherein the first voltage divider means is provided by two legs of the bridge circuit disposed either side of the third node, the third node being the divider output, the temperature dependent resistor element being disposed in a leg of the bridge circuit connected to the fourth node, and the non-inverting input of the first amplifying means being also connected to the fourth node.

8. The measuring system as claimed in claim 7 wherein the temperature dependent resistor element has a positive temperature coefficient and is disposed between nodes 1 and 4 of the bridge circuit.

9. The measuring system as claimed in claim 8 wherein the temperature dependent resistor element is barretter.

10. The measuring system as claimed in claim 7 wherein the temperature dependent resistor element has a negative temperature coefficient and is disposed between nodes 2 and 4 of the bridge circuit.

11. The measuring system as claimed in claim 10 wherein the temperature dependent resistor element is a thermistor.

12. A self-balancing DC-substitution measuring system comprising:

a temperature dependent resistor element;

three substantially temperature independent reference resistors, said temperature dependent and temperature independent resistors forming a Wheatstone bridge circuit, first and second diagonally opposed nodes of said bridge being supply nodes, and third and fourth diagonally opposed nodes of said bridge being sense nodes;

first voltage dividing means connected between said first and second nodes and having a divider output;

a first and a second differential amplifying means, each of said amplifying means having an inverting and a non-inverting input terminal, and an output terminal, the output terminal of the first of said amplifying means being connected to said first node, and the output terminal of the second of said amplifying means being connected to said second node; and a power supply for said amplifying means, second voltage divider means being connected across said power supply and having an output which is a reference point providing a reference potential, said third node connected to the inverting input terminal of said first amplifying means, either said fourth node or said reference point being connected to the non-inverting input of said first amplifying means, said divider output being connected to the inverting input of said second amplifying means, said reference point being connected to the non-inverting input of the second amplifying means, and the position of said temperature dependent element in said bridge being such that the measuring system maintains said third and fourth nodes at a potential substantially equal to the reference potential.

13. The measuring system of claim 12 wherein the first voltage dividing means is provided by two legs of the bridge circuit disposed on either side of the fourth node, the fourth node being the divider output.

14. The measuring system of claim 13 wherein the temperature dependent resistor element has a positive temperature coefficient and is disposed between nodes 2 and 3 or between nodes 1 and 4 of the bridge circuit.

15. The measuring system of claim 14 wherein the temperature dependent resistor element is a barretter.

16. The measuring system of claim 13 wherein the temperature dependent resistor element has a negative temperature coefficient and is disposed between nodes 1 and 3 or between nodes 2 and 4 of the bridge circuit.

17. The measuring system of claim 16 wherein the temperature dependent resistor element is a thermistor.

18. The measuring system as claimed in claim 12 wherein the first voltage divider means is provided by two legs of the bridge circuit disposed either side of the third node, the third node being the divider output, the temperature dependent resistor element being disposed in a leg of the bridge circuit connected to the fourth node, and the non-inverting input of the first amplifying means being also connected to the fourth node.

19. The measuring system as claimed in claim 18 wherein the temperature dependent resistor element has a positive temperature coefficient and is disposed between nodes 1 and 4 of the bridge circuit.

20. The measuring system as claimed in claim 19 wherein the temperature dependent resistor element is barretter.

21. The measuring system as claimed in claim 18 wherein the temperature dependent resistor element has a negative temperature coefficient and is disposed between nodes 2 and 4 of the bridge circuit.

22. The measuring system as claimed in claim 21 wherein the temperature dependent resistor element is a thermistor.

* * * * *